(12) United States Patent
Tracy et al.

(10) Patent No.: US 6,728,557 B1
(45) Date of Patent: Apr. 27, 2004

(54) HINGE ASSEMBLY FOR A MULTI-CONFIGURATION PORTABLE ELECTRONIC DEVICE

(75) Inventors: James L. Tracy, Coral Springs, FL (US); Rudy Yorio, Pompano Beach, FL (US); John F. Jennings, Libertyville, IL (US)

(73) Assignee: Motorola, Inc., Schaumburg, IL (US)

( * ) Notice: Subject to any disclaimer, the term of this patent is extended or adjusted under 35 U.S.C. 154(b) by 151 days.

(21) Appl. No.: 10/150,244

(22) Filed: May 17, 2002

(51) Int. Cl.[7] .............................................. H04M 1/00
(52) U.S. Cl. ..................... 455/575.3; 455/344; 455/348; 455/90.3; 455/566; 439/13; 439/31
(58) Field of Search .......................... 455/575.3, 575.1, 455/575.4, 575.8, 348, 90.2, 90.3, 566, 550.1, 347, 351, 349, 344; 16/221, 223, 242, 243, 277, 282, 319, 366, 374; 439/13, 31, 29, 18; 200/61.7; 361/724, 725

(56) References Cited

U.S. PATENT DOCUMENTS

| | | | | |
|---|---|---|---|---|
| 6,002,946 A | * | 12/1999 | Reber et al. | 455/557 |
| 6,009,336 A | * | 12/1999 | Harris et al. | 455/566 |
| 6,088,240 A | * | 7/2000 | Steinhoff et al. | 361/814 |
| 6,549,789 B1 | * | 4/2003 | Kfoury | 455/550.1 |
| 6,587,675 B1 | * | 7/2003 | Riddiford | 455/557 |
| 2001/0019946 A1 | * | 9/2001 | Okuda | 455/575.3 |
| 2002/0032010 A1 | * | 3/2002 | Okuda et al. | 455/575.3 |

* cited by examiner

Primary Examiner—Vivian Chin
Assistant Examiner—Charles Craver
(74) Attorney, Agent, or Firm—Scott M. Garrett

(57) ABSTRACT

A hinge assembly (2100) includes a hinge body (2102) made of two hinge body halves (900). Each hinge body half is identical so that only one part need be manufactured, and two of them used to form the hinge body. Each hinge body half has a first leg (902) that is longer than a second leg (904). The first leg has a retaining lip (912) at the end which forms a retaining feature. Each leg of the hinge body defines an axis of rotation for the body elements (104, 106). A portion (1508) of a flexible circuit board (1506) is captured between the hinge body halves so as to electrically interconnect circuitry placed in each body element. A detent mechanism is provided to hold the body element in preselected positions with respect to each other, and includes a spring (2106), a cam (2108) and a cap (2110) having cam follower features (2118). The cam is held in place with respect to the body element housing, while the cap is fixed in position with respect to the hinge body. To stabilize the rotation of the body elements, a hook (2404) retains a collar edge (2402) upon rotation of the respective body element.

7 Claims, 12 Drawing Sheets

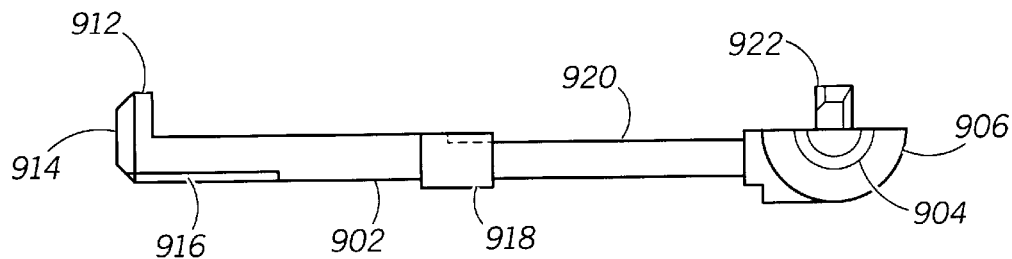
*FIG. 12*
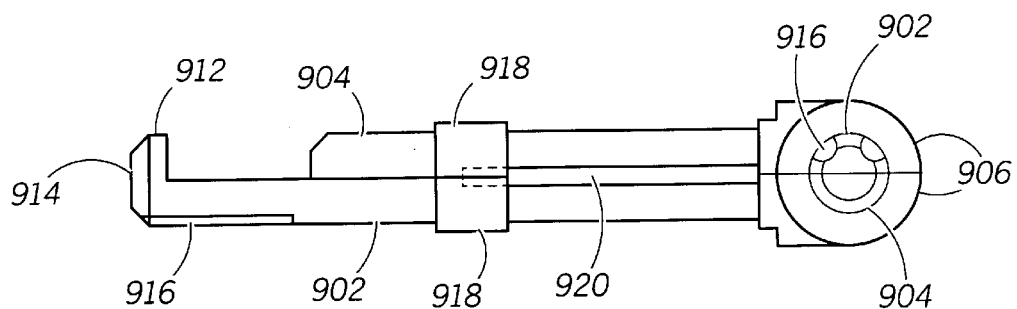
*FIG. 13*
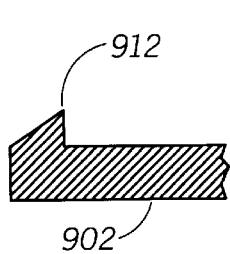 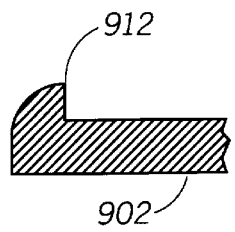 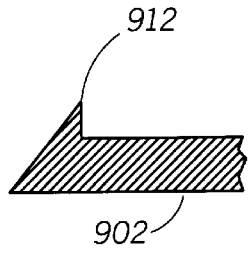
*FIG. 14*   *FIG. 16*   *FIG. 18*
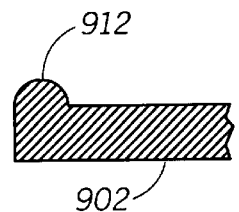 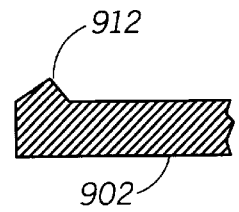 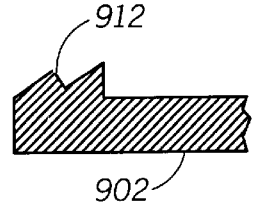
*FIG. 15*   *FIG. 17*   *FIG. 19*

US 6,728,557 B1

HINGE ASSEMBLY FOR A MULTI-CONFIGURATION PORTABLE ELECTRONIC DEVICE

CROSS REFERENCE TO RELATED APPLICATIONS

This patent application is related to copending U.S. patent application having Ser. No. 09/560,977 and entitled "Self-Configuring Multiple Element Portable Electronic Device," assigned to Motorola, Inc.

TECHNICAL FIELD

The present invention relates generally to portable electronic devices, and more particularly to portable electronic devices having multiple elements, and the means of connecting those elements.

BACKGROUND OF THE INVENTION

Many portable electronic devices exist that are designed for making life easier and more productive. Devices such as cellular phones, pagers, and personal digital assistants (PDAs) perform valuable functions such as communications, messaging, data storage and recall, etc.

These portable electronic devices often have two parts, a hinged cover having a display and a body having a keyboard. The display is typically chosen to match the intended purpose. For example, PDAs typically have a relatively large display, useful for displaying text and graphics. Cellular phones, on the other hand, typically have smaller displays designed for displaying a limited number of alphanumeric characters. This makes sense, as production costs may be kept down by including only the required capabilities in the device.

More and more, people find such portable electronic devices to be invaluable for keeping in touch with co-workers, family, and friends, and for organizing a busy lifestyle. As the demand for portable electronic devices increases, these devices tend to increase in functions, features, and complexity. However, such devices still tend to remain as distinct units due to the increased complexity and difficulty of use that often comes with integration of multiple devices.

Integration of multiple devices is understandably difficult, due to the need for providing different functions that intermesh operationally while sharing inputs, outputs, and other resources. This is further complicated by the need to create a device that is intuitively simple to use.

Non-integration of portable electronic devices produces several drawbacks. First, there are the obvious drawbacks such as needing multiple devices to accomplish all desired functions, along with the attendant size and weight inconvenience. Second, non-integration means that multiple devices have duplicate components, such as heavy and bulky displays, input devices, and power sources. Third, the increased use of microprocessors and their increasing capabilities allow devices to be developed that are flexible and can be configured to perform multiple functions. Fourth, integrating devices to share common components and to cooperatively function could provide increased value to consumers while reducing prices.

BRIEF DESCRIPTION OF THE DRAWINGS

FIG. 12 shows a side elevation view of a hinge body half as shown in FIG. 9;

FIG. 13 shows a side elevation view of the hinge body formed by placing two hinge body halves together;

FIGS. 14–19 show various cut-away side views of the retaining features that may be used at the distal end of the first axial portion of a hinge body half;

DETAILED DESCRIPTION OF A PREFERRED EMBODIMENT

Figure 1:
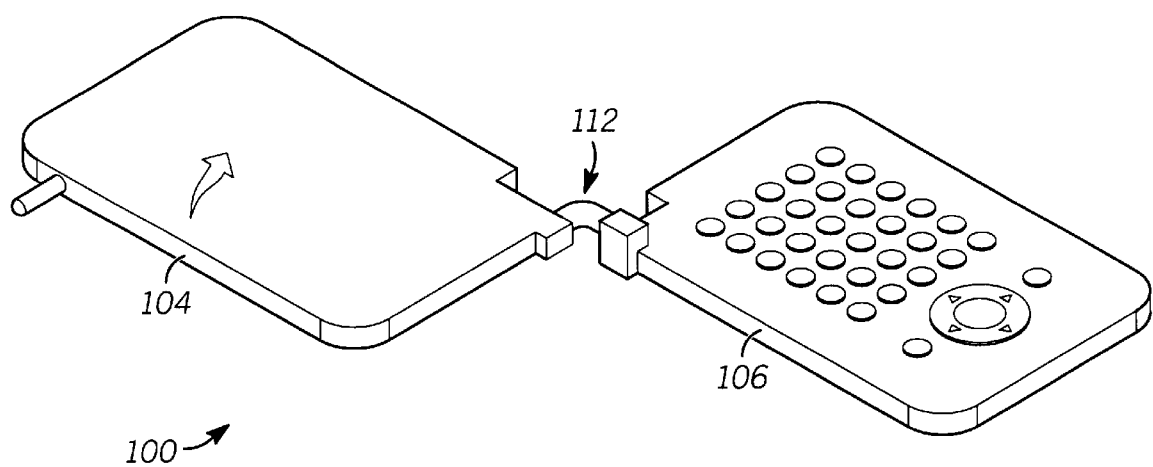
FIGS. 1–8 show a multi-configuration portable electronic communication device, and examples of the various configurations in which the device can be operated.
Figure 2:
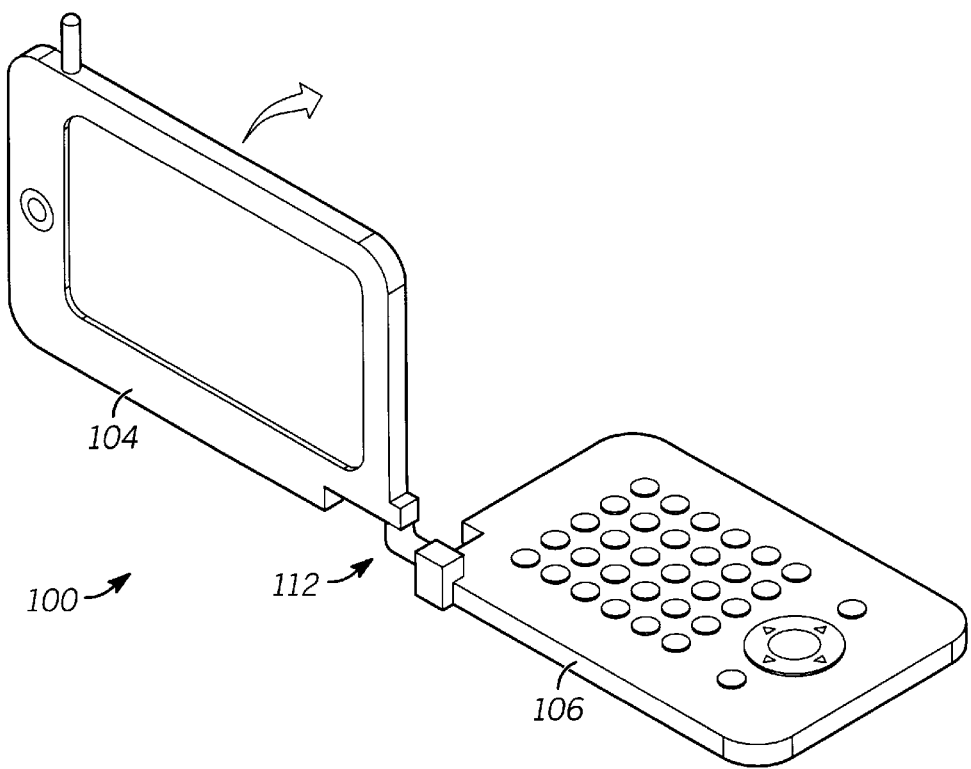
Figure 3:
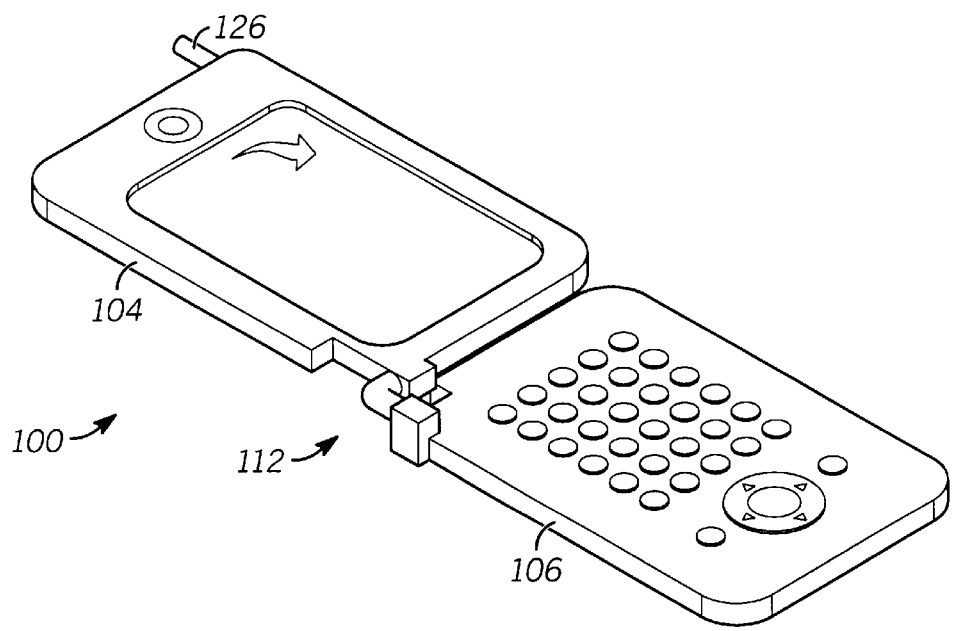

While the specification concludes with claims defining the features of the invention that are regarded as novel, it is believed that the invention will be better understood from a consideration of the following description in conjunction with the drawing figures, in which like reference numerals are carried forward. A brief description of the prior art is also thought to be useful.

A multi-configuration portable electronic device comprises at least two body elements. Typically one element comprises a display for displaying information graphically, and the other element comprises an input mechanism such as a keypad or keyboard and other buttons for navigating a cursor or pointer displayed on the display. Now turning to FIGS. 1–8 show a multi-configuration portable electronic communication device 100 having a first body element 104 joined to a second body element 106 by a joint 112. FIGS. 1–4 show a configuration sequence wherein the first body element 104 and the second body element 106 are manipulated to place the device 100 into a portrait configuration.

Figure 4:
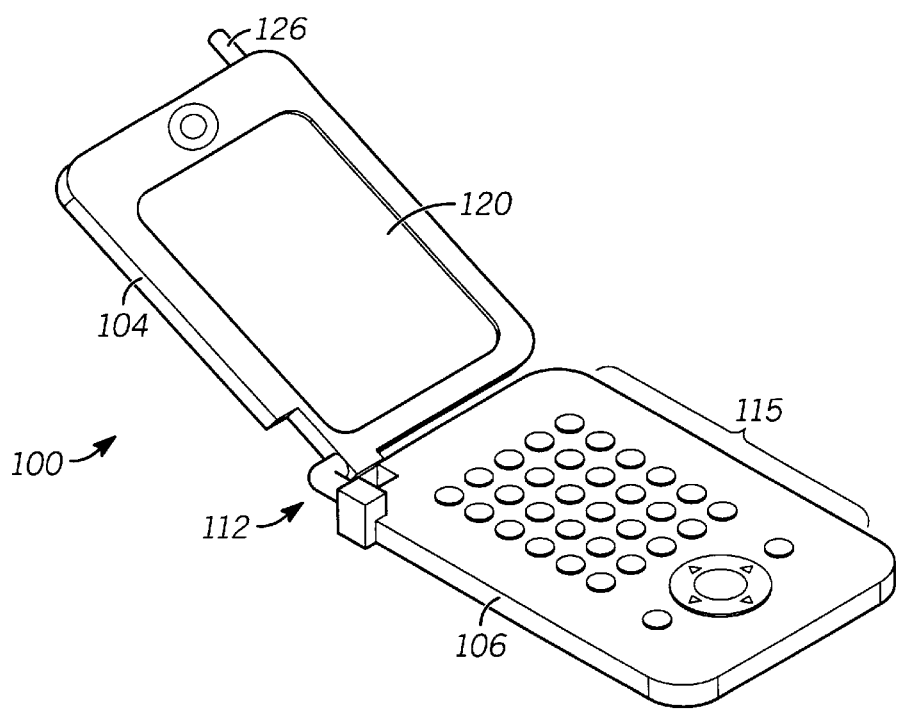
Figure 5:
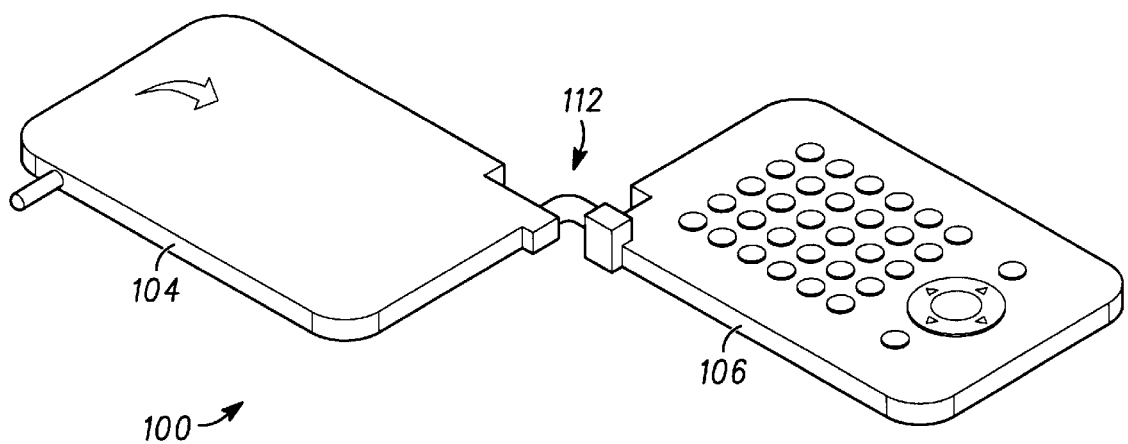
Figure 6:
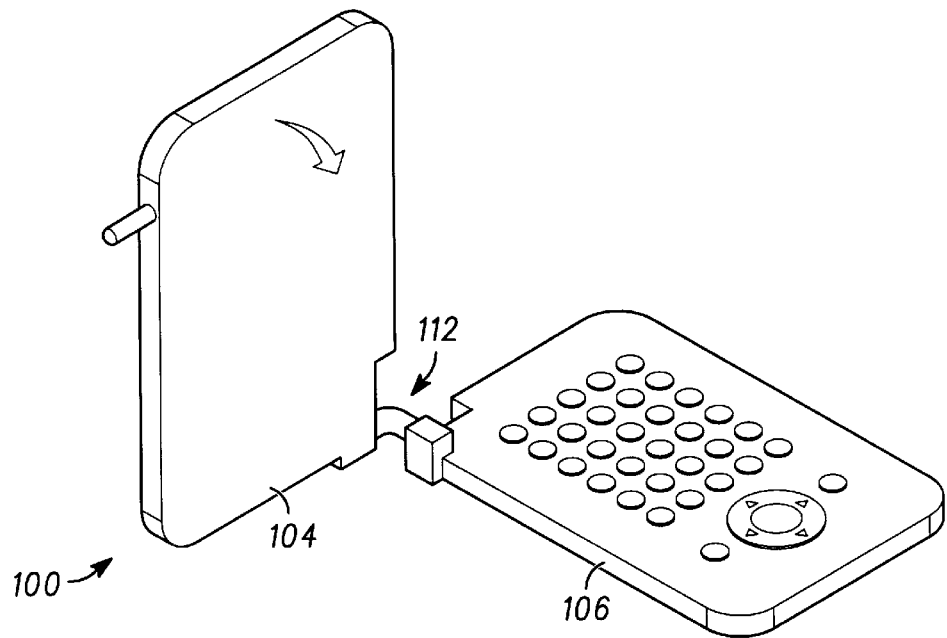
Figure 7:
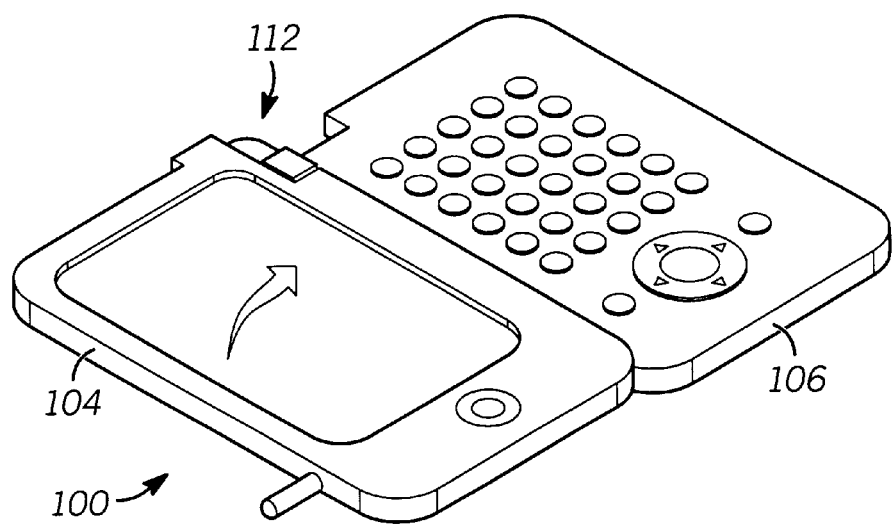

FIG. 4 shows a multi-configuration device 100 when it is configured in a portrait configuration such as, for example, a cellular phone. A long dimension of the typically rectangular display 120 is vertically (or longitudinally) positioned when in use. Because the display 120 is therefore positioned like a portrait of a person, it is known as a portrait mode. The portrait configuration is also reflected in the inputs 115 of the second element 106, which may be configured to reflect the portrait mode and may include numeric keys and other phone keys. The first body element 104 may be rotated down to a closed position parallel to, and in contact with, the second body element 106 to assume a closed configuration (not shown). The closed position is typical of a cellular phone wherein a body and a lid may be folded together and closed during non-use, such as when the device is being carried on a belt holder, or in a purse, for example.

FIGS. 5–8 show a configuration sequence wherein the first body element 104 and the second body element 106 are manipulated to place the device 100 into a landscape configuration.

Figure 8:
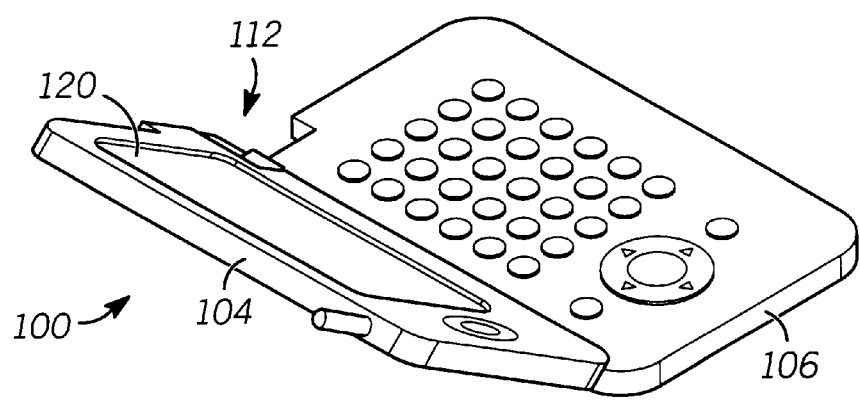

FIG. 8 shows a multi-configuration portable electronic communication device 100 in a landscape configuration, such as, for example, a pager. In the landscape configuration, the display 120 has the long dimension in a substantially lateral position, as is the second element 106. This may also be appropriate for a device such as a personal digital assistant (PDA) or other electronic appliances. Again, the first body element 104 may be rotated down to a closed position parallel to and in contact with the second body element 106 to assume a closed configuration (not shown).

The device illustrated in FIGS. 1–8 is the subject of related United States patent application having the Ser. No. 09/560,977. The joint 112 is hollow so that wires of other connectors may pass through and electrically interconnect circuitry disposed in each of the elements. Arranging conductors so that they pass through a hollow member is a well-known approach to electrically interconnecting such elements. However, this approach has the disadvantage of requiring either wires to be threaded through the tube, which is inefficient in high volume manufacturing, or the use of a flexible circuit board having a portion that passes through the tube. The latter approach suffering from the flexible circuit boar being twisted upon moving the body elements. In high volume manufacturing it is preferable to use flexible circuit boards. It would be possible to thread an elbow shaped flexible circuit board through the tube, with probably more difficulty than threading wires through the tube, and the flexible circuit board would be subject to twisting each time the elements are reconfigured. The repetitive stress could eventually lead to tearing of the flexible circuit board, rendering the device inoperative. Clearly these are issues best avoided.

The present invention solves these problems by use of a novel hinge mechanism that uses a flexible circuit board to interconnect the two elements of the multi-configuration portable electronic device, but does not twist the flexible circuit board. The hinge mechanism uses a pair of identical, asymmetric hinge body halves that interlock when put together. Each hinge body half has a recessed portion throughout the elbow portion and partially along each axial portion or leg so that a portion of a flexible circuit board may be captured between the hinge body halves. The asymmetric legs of the hinge body half, when placed together, form capturing features for retaining a portion of a flexible circuit board in a manner that eliminates twist, and spring-loaded cam mechanisms to provide detent to hold the elements in closed, portrait, or landscape configurations for ease of use. Hooks disposed on the body elements interlock with the hinge assembly to stabilize movement of the elements with respect to each other.

Figure 9:
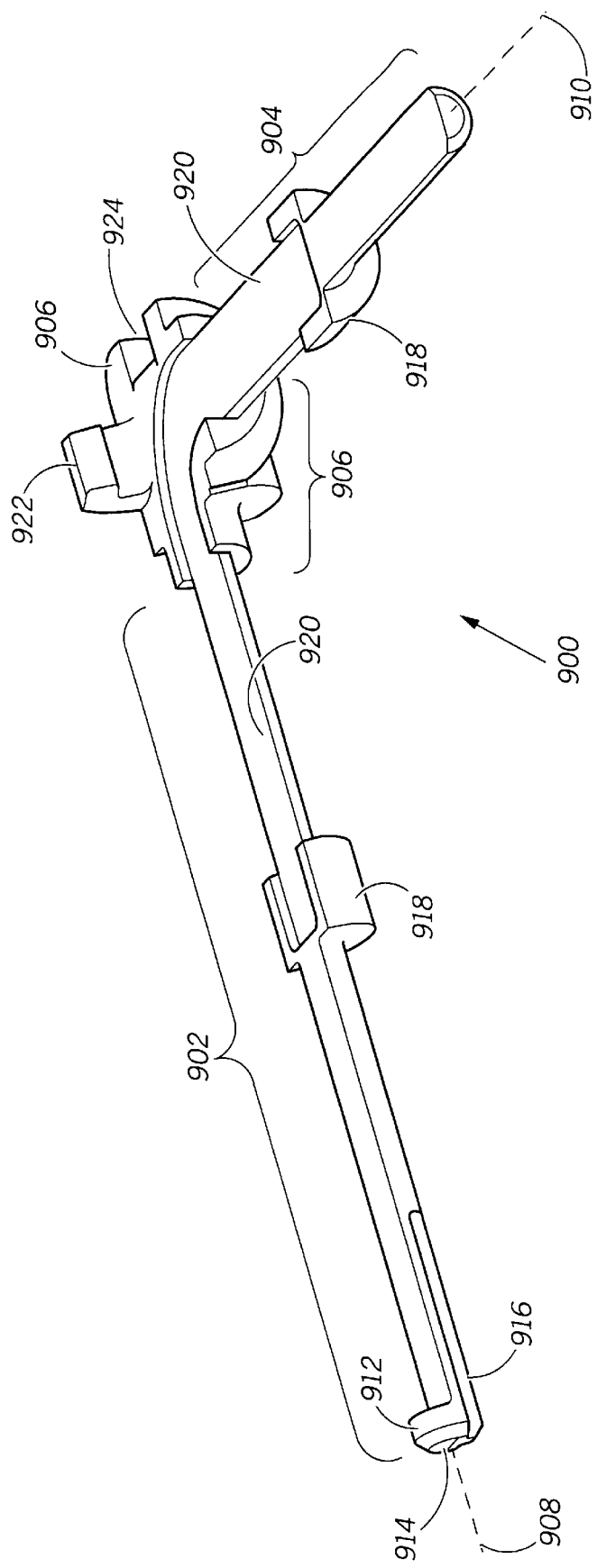
FIG. 9 shows an isometric view of a hinge body half designed in accordance with the invention.

Referring now to FIG. 9, there is shown an isometric view of a hinge body half 900 designed in accordance with the invention. There are three main sections to the hinge body half; a first axial portion 902, a second axial portion 904, and a corner portion 906. The first axial portion 902 extends away from the corner portion in a first direction along a first axis 908, and the second axial portion extends away from the corner portion along a second axis 910. The first and second axes intersect at the corner portion, and define a plane. In the preferred embodiment, the axial portions are substantially half-cylindrical, each being cut substantially along its respective axis along the plane formed by the two axial portions. The corner portion in the preferred embodiment is a 90-degree corner to accommodate the portrait and landscape positions of the multi-configuration device, but it may be formed at other angles if so desired. The first axial portion is longer than the second axial portion, and has a retaining feature 912 formed at the distal end 914. FIGS. 14–19 show various cut-away side views of the retaining features that may be used at the distal end of the first axial portion of a hinge body half. Furthermore, in the preferred embodiment, an alignment groove or channel 916 may be formed at one or more locations along the first, second, or both axial portions, preferably beginning at the end and running along the axial portion towards the corner portion. Each axial portion has a barrel portion 918. The barrel portion of each axial portion is equidistant from the corner portion, meaning from the center of the corner portion, or an apex of the corner portion. A recessed portion 920 is formed contiguously along a portion of each of the first and second axial portions, and through the corner portion. The recessed portion may extend into the barrel portions, but does not extend to the ends of the axial portions. The purpose of having the recessed portion extend into the barrel portions is to capture a portion of the flexible circuit board to retain it in place upon assembly. Note that the barrel and corner portions provide a shoulder on either side of the recessed portion, but in the areas between the barrel and corner portions there is no shoulder.

Figure 10:
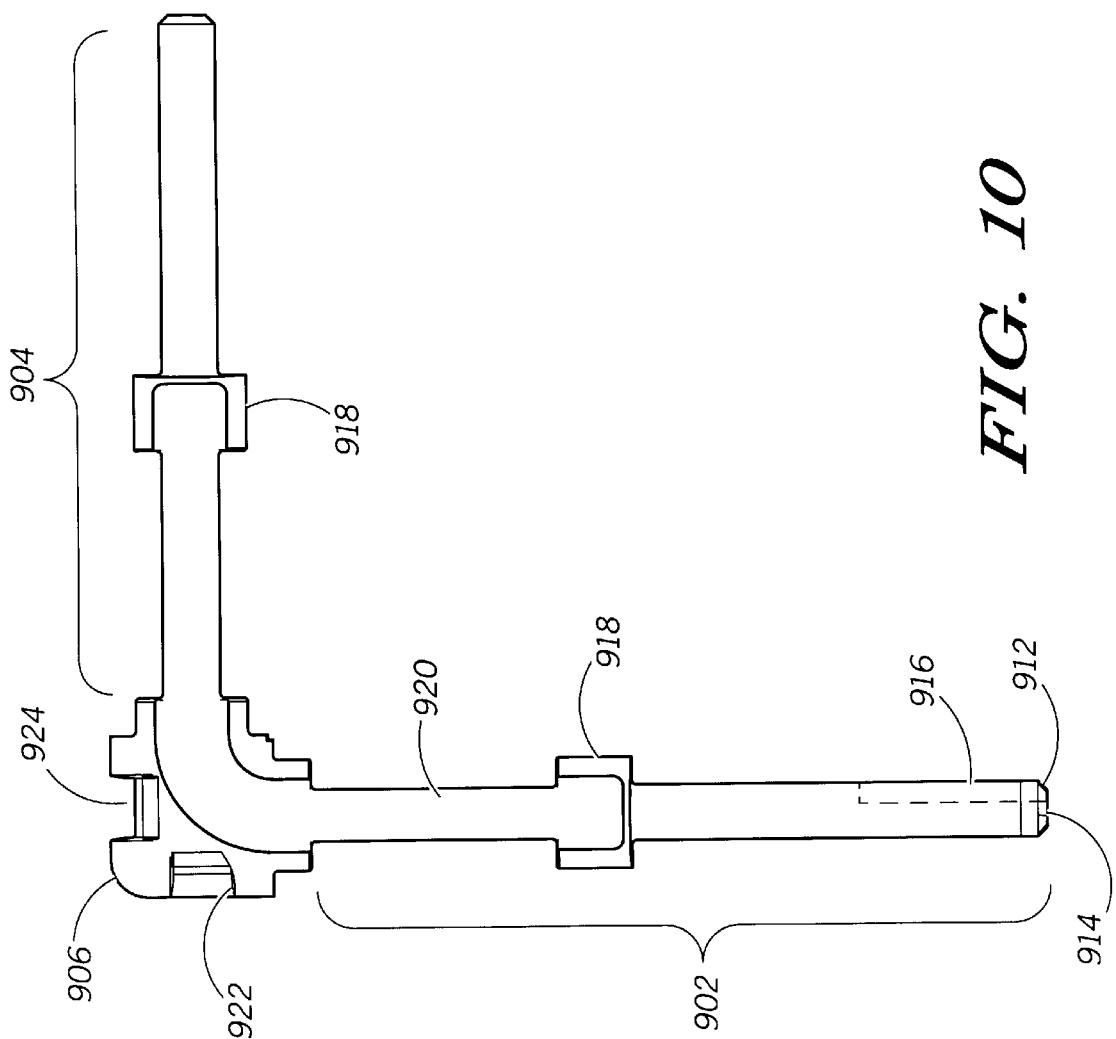
FIG. 10 shows a top plan view of a hinge body half as shown in FIG. 9.

FIG. 10 shows a top plan view of a hinge body half as shown in FIG. 9; FIG. 12 shows a side elevation view of a hinge body half as shown in FIG. 9.

Figure 11:
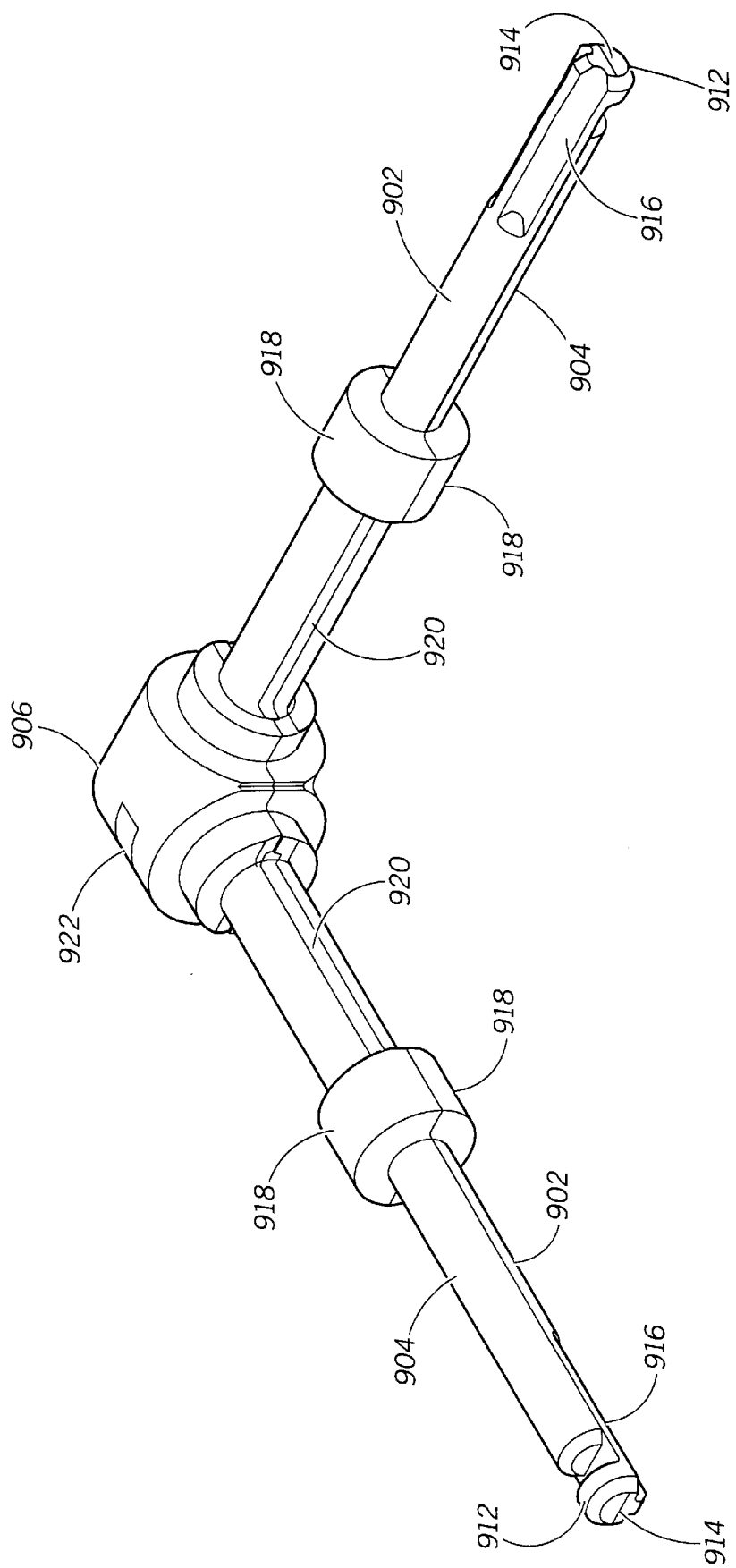
FIG. 11 shows an isometric view of a hinge body formed by two identical hinge body halves as shown in FIG. 9.

The reason for the asymmetric axial portion lengths, is that two identical hinge body halves can be placed together to form the hinge body. Referring now to FIG. 11, there is shown an isometric view of a hinge body formed by two identical hinge body halves. A first axial portion of a first hinge body half and the second axial portion of a second body half lie together to form one leg, while the corresponding axial portions lie together to form another identical leg, rotated about its axis by 180 degrees. In this view it can be seen that, because of the difference in lengths of the axial portions, a gap is formed between the end of the second axial portion 904 and the retaining feature 912 at the distal end 914 of the first axial portion. This feature is used by other components of the hinge assembly, as will be described below. It can also be seen that the barrel portion of each of the axial portions form enlarged cylindrical sections. The recessed portions of each hinge body half, when the halves are placed together, form a passageway through the corner portion, in which a portion of a flexible circuit will sit, as described below. FIG. 13 shows a side elevation view of the hinge body formed by placing two hinge body halves together. In this view one leg of the hinge body can be seen from the side, and the other leg's end can be seen. To assist in assembling the hinge body halves into a hinge body, each hinge body half in the preferred embodiment includes a means for interlocking disposed on the corner portion for interlocking with a second hinge body half that is identical to the first hinge body half. In particular, a raised member 922 is formed on the corner portion adjacent the first axial portion along the first axis, and a receiving notch 924 is formed on the corner portion adjacent the second axial portion along the second axis in a corresponding location.

When a first hinge body half is placed onto another, the raised member 922 fits into the receiving notch of the other hinge body half. Locking features may be designed into these features for a snap lock, as is well known in the art. Thus, when two hinge body halves are placed together, they form a symmetric hinge body.

Figure 20:
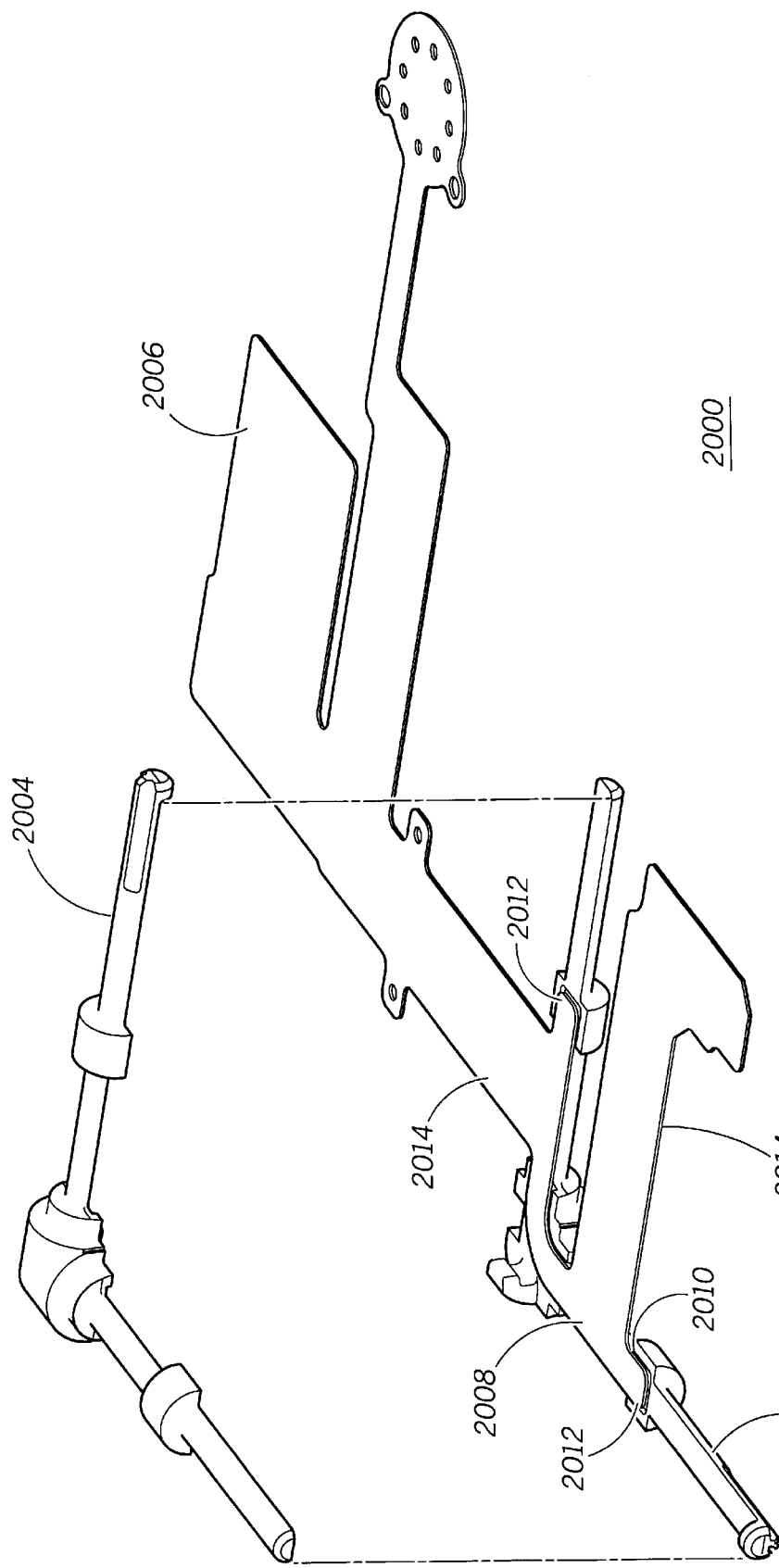
FIG. 20 shows an exploded isometric view of a hinge body and a flexible circuit board for use therewith.

Referring now to FIG. 20, there is shown an exploded view 2000 of a hinge body and a flexible circuit board for use therewith. The hinge body is comprised of a first hinge body half 2002 and a second hinge body half 2004. These hinge body halves are substantially the same as that shown in FIGS. 9–13. A flexible circuit board 2006 has a connecting portion 2008 is shaped in correspondence with the recessed portions 2010 of the hinge body halves. When the halves are placed together, they capture the connecting portion of the flexible circuit board between them. In the preferred embodiment, the recessed portion of each hinge body half extends into the barrel portions, and the connecting portion of the flexible circuit board has tabs 2012 that fit into the recessed area of the barrel portions to help retain the flexible circuit board. The flexible circuit board is used to connect circuitry in the first body element 104 with circuitry in the second body element 106, both of which are shown in FIGS. 1–8. The hinge assembly is rotated about the axis of either leg of the hinge body. Note that because the hinge body is rigid, the connecting portion is not twisted upon rotation of the hinge body about the axis of either leg. In the preferred embodiment, the flexible circuit board comprises neck portions 2014 that are rolled about the legs of the hinge body once the hinge body halves are placed together. The rolled portion then provides slack and eliminates stress on the flexible circuit board upon rotating the body elements into different positions.

Figure 21:
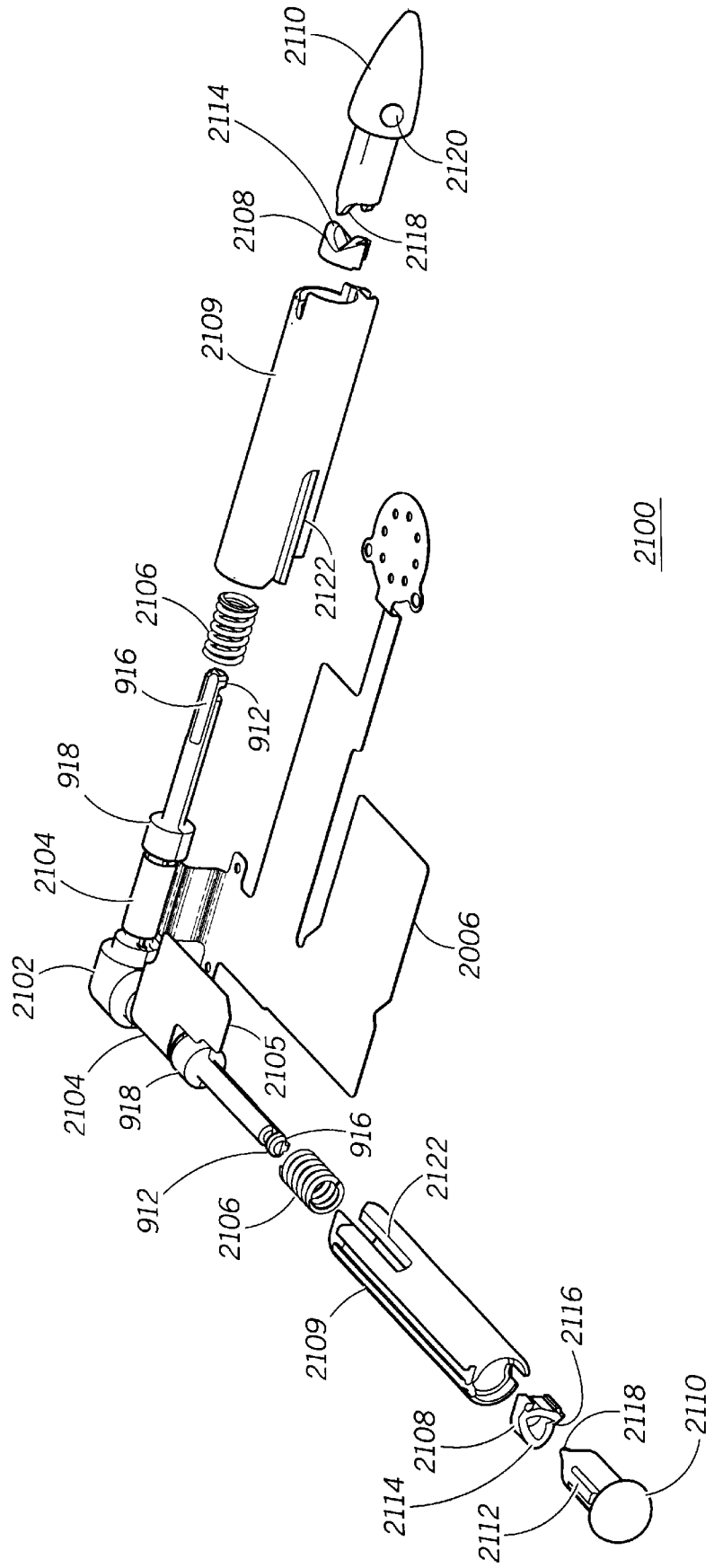
FIG. 21 shows an exploded isometric view of the hinge assembly with the flexible circuit board captured in the hinge body.

The rolled portions 2104 can be seen in FIG. 21, which shows an exploded isometric view of the hinge assembly 2100 with the flexible circuit board 2006 captured in the hinge body 2102. The neck portions of the flexible circuit board are rolled around their respective legs of the hinge body. In this configuration, a first portion of the flexible circuit board 2105 is disposed in one body element while the other portion of the circuit board is disposed in a second body element. As the body elements are moved, they rotate about the axes defined by the legs of the hinge body. Thus, the portion of the flexible circuit board through the neck portion is not subjected to any twisting. Furthermore, by wrapping the neck portions of the flexible circuit board around the hinge body legs, the rolled portion provides slack so that when the body elements are moved, there is no substantial stress on the flexible circuit board. During assembly, the flexible circuit board is accommodated by a slot 2122 in each housing hinge portion 2109.

The hinge assembly further includes a means for providing detent so that the body elements are urged into particular positions when being reconfigured. Detent provides a soft locking of the body elements into certain positions. If detent were not provided, the body elements would simply fall to whatever position they were allowed, and it would make the multi-configuration device difficult to operate because the body elements would not stay in place, requiring the user to hold them while trying to operate the device.

Figure 22:
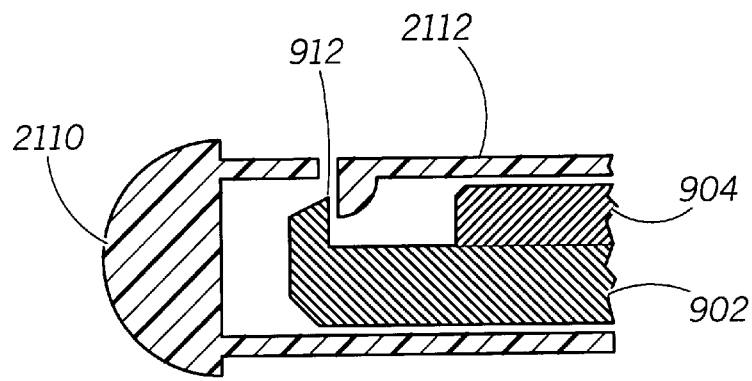
FIG. 22 shows a cut-away side view of the cap and end portion of a hinge body leg for retaining the cap on the leg.
Figure 23:
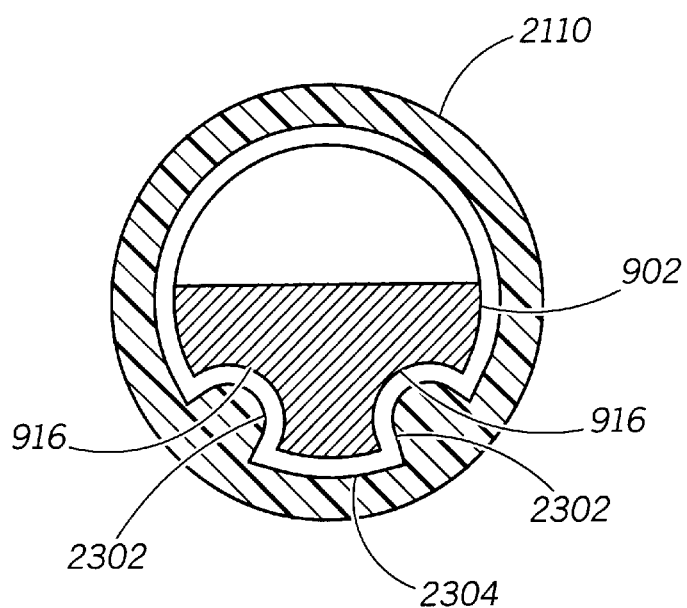
FIG. 23 shows a cross sectional view of a cap installed over a hinge body leg.
Figure 25:
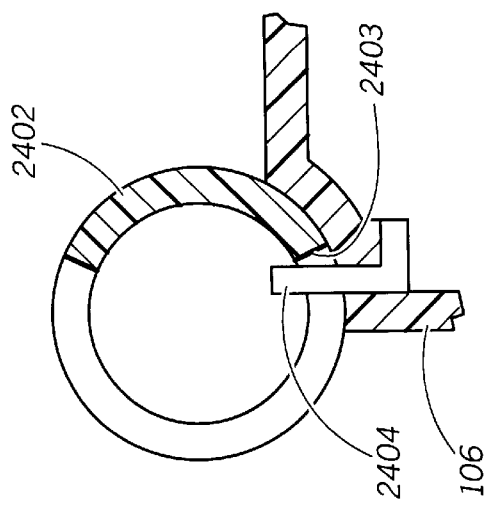
FIG. 25 shows a cut-away side view of a collar portion of the hinge assembly and a hook member for retaining the axial position of the collar portion during rotation of a body element.

The detent mechanism of the preferred embodiment includes a spring 2106 on each leg, abutting the barrel portion 918. A cam 2108 is then loaded over each leg of the hinge body, and abuts the spring. The cam has anti-rotation features on its outer diameter which mate with features inside the housing hinge portions 2109, which are preferably substantially tubular or cylindrical in shape. The housing hinge portions are the portions of the housing of the multi-configuration portable electronic device in which the legs of the hinge body reside. They are shown here as cut-away segments for clarity. The cam may have rails or slots or an eccentric shape or other features that correspond with features in the housing hinge portion to prevent it from rotating with respect to the housing. A cap 2110 is then placed over the end of the hinge body leg and against the cam in a way that compresses the spring, thus biasing the cam against the cap. The cap has cam following features 2118 that fit in the cam valleys between the cam lobes 2114. The cap is held in place by an integral cantilevered member 2112 which engages the retaining feature of the first axial portion of each hinge body half. A cut-away view of the cap 2200 so engaged is shown in FIG. 22. Briefly, the cantilevered member has a ramp so that as the cap is pushed toward the leg of the hinge body, the cantilevered member is deflected up until the it is past the retaining feature 912, whereupon it returns to its unbiased position, and thereby locking the cap onto the end of the leg of the hinge body. The caps also have anti-rotation features to prevent them from rotating with respect to the legs of the hinge body. In the preferred embodiment the caps have features which align with the grooves 916 of the first axial portion of each leg of the hinge body. Referring briefly to FIG. 23, there is shown a cross sectional view 2300 of a cap installed over a hinge body leg. Raised portions 2302 on the inside of the cap 2110 fill in the groove or grooves 916, and form a trench 2304 in the cap.

The cams have lobes 2114 and valleys 2116 formed thereon which correspond to cam followers 1611 on the caps 2110. As a body element is rotated, the cam is rotated with respect to the cam followers on the cap, which cause the cam to compress the spring initially. As the body element reaches its intended position, the cam followers fall into the other valley on the cam, and the spring biases the cam against the cap, thereby holding the body element in place for ease of use. This detent mechanism is used on both legs of the hinge body so that detent can be provided for the portrait, landscape, and closed positions. Thus, detent is provided by the hinge assembly. To prevent over-rotation of the body elements, it is contemplated that ridges may be formed on the outer surface of the housing hinge portions that meet when the body elements are opened to the detented positions.

In order to determine when the body elements are moved, a magnet 1620 is disposed in the cap 2110. The magnet is sensed by one or more Hall effect sensors (not shown) in the body of the device. The device has circuitry for sensing the presence of the magnet via the Hall effect device, and can then configure its operation to match its physical configuration. That is, when the device is opened into a portrait configuration, the device will operate as, for example, a cellular radio-telephone. Hall effect sensing in this manner is well known in the art.

Thus far the hinge assembly has shown how a hinge can allow dual rotation, while carrying a flexible circuit board within and through the hinge, without twisting the flexible circuit board. It also provides a means for holding different elements into preferred positions via a detent mechanism. This hinge is particularly suited for use in a multi-configuration portable electronic device, but may have other applications in addition to such devices. The hinge, as described so far, allows rotation about the axis of either hinge body leg. To stabilize the body element being rotated, an additional feature is provided by the invention. A collar portion that interlocks with a hook member, each disposed on different body elements of the multi-configuration device, provides the added stability.

Referring now to FIG. 19, there is shown an isometric view 2400 of a multi-configuration portable electronic device, in accordance with the invention. The device, as shown in FIGS. 1–8, comprises a first body element 104 and a second body element 106. A portion of the first body element 2401 houses a first leg of the hinge, while a similar portion houses the other leg of the hinge (not shown). To stabilize rotation of the body elements, a collar portion 2402 is provided. The collar portion is coaxial with the leg of the hinge, and is preferably disposed between the cap 2110 and the rest of the housing portion 2401 housing the hinge leg and detent mechanism. The collar portion may be formed integrally with the housing of the first body element 104, or it may be provided as a separate piece to be assembled with the other hinge elements. The collar is cylindrical, and hollow, and has a slot with a cut-out 2403 that allows a hook member 2404 to enter into the collar portion when the first and second body elements are closed together. When the first body element is then rotated up, about the axis of the housing portion 2401, the hook member engages the edge of the collar portion on the inside of the collar portion to prevent lifting of the first body element away from the second body element about the other hinge leg's axis. This is further shown in FIG. 20, which shows a cut-away side view of the collar portion 1902 and hook member 2404. Here, the housing of the first body element is raised, so the cut-out 2403 is rotated as well. The hook member 2404 catches the edge of the collar portion to retain it, and the first body element, in position. A similar structure is provided on the other leg of the hinge to stabilize rotation of the first body element about the axis of that hinge leg. The slot can be designed so that it prevents over-rotation of the body elements by making the slot only long enough around the collar portion so that the hook member reaches the end of the slot once the body elements are opened and in the detented position.

Figure 26:
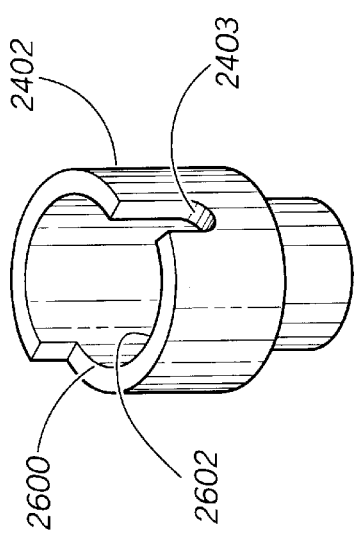
FIG. 26 shows an isometric view of a collar for retaining the body element together when the multi-configuration device is in use.
Figure 24:
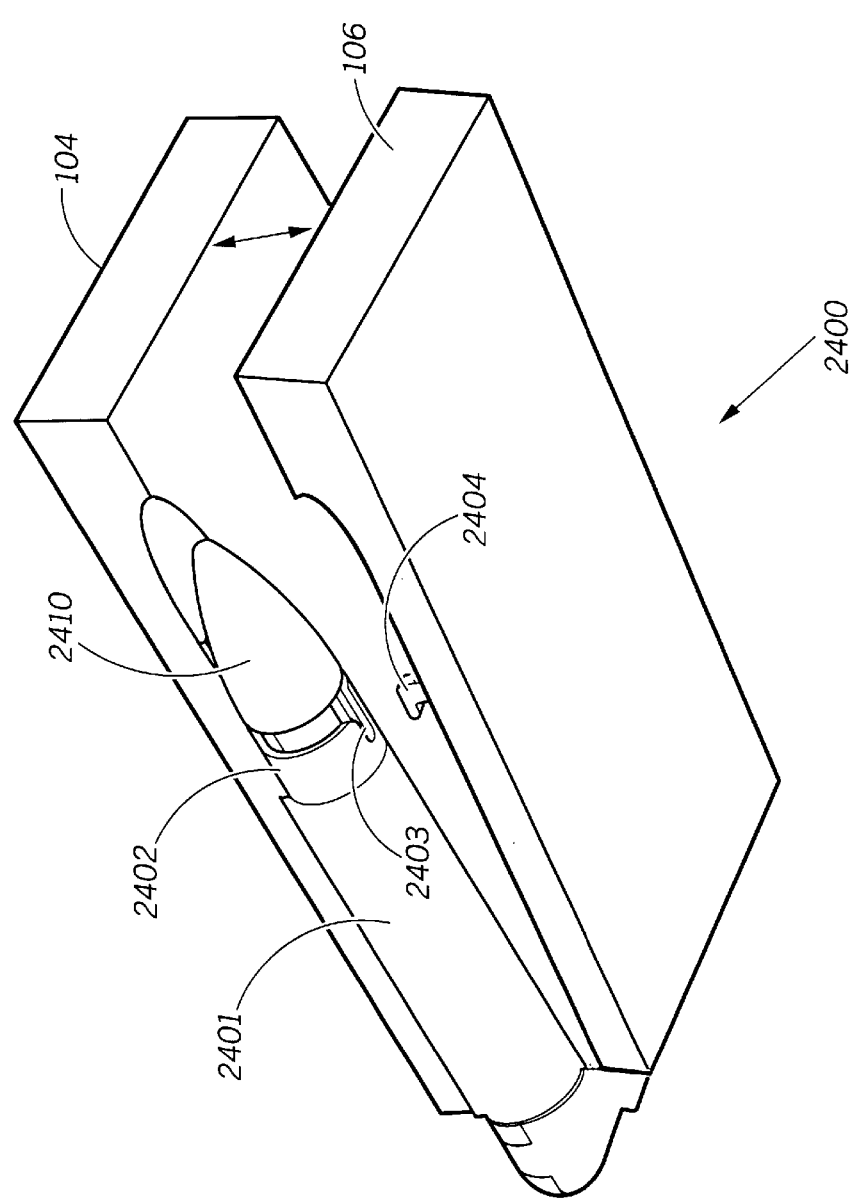
FIG. 24 shows an isometric view of a multi-configuration portable electronic device, in accordance with the invention.

FIG. 26 shows an isometric view of a collar 2402 for use with the invention. The collar may be an independent part, as shown here, or it may alternatively be formed integrally with the hinge housing portion (2109). The collar has a cutout 2403. The hook member (2404) engages the edge portion 2600 and an inside edge 2602. The edge extends the cutout, at a narrower width, to form a slot which allows for rotation of the body elements.

The invention therefore includes a unique hinge body half, and uses two hinge body halves to form a hinge body. Each hinge body half is identical so that only one part needs to be manufactured, thereby reducing manufacturing costs. Each hinge body half has a corner portion, a first axial portion extending from the corner portion along a first axis, a second axial portion extending from the corner portion along a second axis, barrel portions formed on each of the first and second axial portion at points equidistant from the center of the corner portion, a recessed portion formed contiguously along a portion of each of the first and second axial portions and through the corner portion, and wherein the first axial portion being longer that the second axial portion. The first axial portion has a retaining feature formed at a distal end of first axial portion. Each hinge body half preferably comprises a means for interlocking with a second hinge body half. For example, each hinge body half may comprise a raised member formed on the corner portion adjacent the first axial portion along the first axis, and a receiving notch formed on the corner portion adjacent the second axial portion along the second axis. The raised member and receiving notch are located equidistant along the first and second axes from the center of the corner portion. To provided anti-rotation for detent action, it is further preferred that each hinge body half comprises a grooved portion on at least one of the first or second axial portions, and preferably both portions. Typically the grooved portion will be located at a distal end of at least one of the first and second axial portions.

The invention also provides a hinge assembly for a multi-configuration portable electronic device. The hinge assembly comprises the hinge body made up of first and second identical hinge body halves, as described above. The hinge body is formed by placing together two hinge body halves such that the first axial portion of the first body halve is coaxial with the second axial portion of the second body half thereby forming a first leg of the hinge body, and the second axial portion of the first body halve is coaxial with the first axial portion of the second body half thereby forming a second leg of the hinge body, the recessed portions of each of the first and second hinge body halves forming a passageway through the corner portion. To electrically interconnect circuitry disposed in each of the body elements, a flexible circuit board having a first board portion, a second board portion, and a connecting portion corresponding to and disposed in the passageway through the corner portion is included. As stated before, it is preferable to provide a detent means. In the preferred embodiment, the detent means comprises a spring disposed coaxially with at least one of the first and second legs of the hinge body, and against the barrel portion, a cam disposed coaxially with the spring and against the spring, the cam having at least one lobe and valley, and a cap having at least one cam follower corresponding the cam, and fixed in position with hinge body leg.

The invention also provides a multi-configuration portable electronic device utilizing the hinge and hinge assembly. The multi-configuration portable electronic device includes a first body element having electrical circuitry disposed therein, a second body element having electrical circuitry disposed therein, and a hinge for allowing configuration of the first and second body elements into at least portrait, landscape, and closed positions, and for routing a flexible circuit board between the first and second body elements wherein upon movement of the first and second body elements the hinge prevents twisting of the flexible circuit board. It is further preferred that the hinge assembly provide detent for holding the first and second body elements in at least portrait, landscape, and closed positions. In addition to the detent mechanism, the stabilize the body elements during rotation to either the portrait, landscape, or closed positions, and between those positions, the invention provides a hook member disposed on each of the first and second body elements and each hook member being located in correspondence with a collar portion of the other body element. The hook member retains the collar portion upon rotation of one of the body elements about the hinge.

Thus, the invention solves the problems associated with the prior art with regard to electrically interconnecting circuitry disposed in different body elements of a multi-configuration electronic device. The invention solves these problems with a novel hinge comprised of identical hinge body halves which capture a portion of a flexible circuit board between them so as to prevent twisting of the flexible circuit board. Furthermore the invention provides neck portions on the flexible circuit board that are wrapped around the hinge body to prevent stressing the flexible circuit board upon movement of the body elements. The invention also provides a means for stabilizing movement of the body elements with respect to each other by securing the end of the hinge away from the corner of the hinge during rotation of the body elements about the different hinge axes.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A hinge body half for forming a hinge of a multi-element portable electronic device, comprising:
   a corner portion of the hinge body half having a center;
   a first axial portion extending from the corner portion along a first axis;
   a second axial portion extending from the corner portion along a second axis;
   barrel portions formed on each of the first and second axial portion at points equidistant from the center of the corner portion;
   a recessed portion formed contiguously along a portion of each of the first and second axial portions and through the corner portion; and
   the first axial portion being longer that the second axial portion, and having a retaining feature formed at a distal end of first axial portion.

2. A hinge body half a defined in claim 1, wherein the hinge body half is a first hinge body half, the hinge body half further comprising a means for interlocking disposed on the corner portion for interlocking with a second hinge body half that is identical to the first hinge body half, thereby forming a whole hinge body when the first and second hinge body halves are interlocked.

3. A hinge body half as defined in claim 2 wherein the means for interlocking comprises:
   a raised member formed on the corner portion adjacent the first axial portion along the first axis; and
   a receiving notch formed on the corner portion adjacent the second axial portion along the second axis;
   wherein the raised member and receiving notch are located equidistant along the first and second axes from the center of the corner portion.

4. A hinge body half as defined in claim 1, further comprising a grooved portion on at least one of the first and second axial portions.

5. A hinge body half as defined by claim 4 wherein the grooved portion is on a distal end of at least one of the first and second axial portions.

6. A hinge assembly for a multi-configuration portable electronic device, the multi-configuration portable electronic device having two body elements, the hinge assembly facilitating use of the multi-configuration portable electronic device in a landscape mode, a portrait mode, or a closed mode, the hinge assembly comprising:
   a hinge body comprised of first and second identical hinge body halves, each hinge body half comprising:
      a corner portion;
      first and second axial portions wherein the first axial portion is longer than the second axial portion and has a retaining feature disposed on a distal end of the first axial portion, the first axial portion extending away form the corner portion along a first axis, the second axial portion extending away from the cornier portion along a second direction;
      barrel portions formed equidistant along each of the first and second axial portions; and
      a recessed portion formed contiguously along a portion of each of the first and second axial portions and through the corner portion;
      wherein the first and second hinge body halves are placed together such that the first axial portion of the first body halve is coaxial with the second axial portion of the second body half thereby forming a first leg of the hinge body, and the second axial portion of the first body halve is coaxial with the first axial portion of the second body half thereby forming a second leg of the hinge body, the recessed portions of each of the first and second hinge body halves forming a passageway through the corner portion; and
   a flexible circuit board having a first board portion, a second board portion, and a connecting portion corresponding to and disposed in the passageway through the corner portion.

7. A hinge assembly as defined in claim 6, further comprising a detent means comprised of a spring disposed coaxially with at least one of the first and second legs of the hinge body, and against the barrel portion, a cam disposed coaxially with the spring and against the spring, the cam having at least one lobe and valley, and a cap having at least one cam follower corresponding the cam, and fixed in position with hinge body leg.

* * * * *